(12) United States Patent
Lai et al.

(10) Patent No.: US 8,913,035 B2
(45) Date of Patent: Dec. 16, 2014

(54) OPTICAL TOUCH PANEL AND LIGHT GUIDE MODULE THEREOF

(75) Inventors: Hung-Ching Lai, Hsinchu County (TW); Kuo-Hsiung Li, Hsinchu County (TW); Hui-Hsuan Chen, Hsinchu County (TW)

(73) Assignee: Pixart Imaging Inc., Hsinchu County (TW)

( * ) Notice: Subject to any disclaimer, the term of this patent is extended or adjusted under 35 U.S.C. 154(b) by 876 days.

(21) Appl. No.: 13/096,789

(22) Filed: Apr. 28, 2011

(65) Prior Publication Data

US 2012/0206409 A1    Aug. 16, 2012

(30) Foreign Application Priority Data

Feb. 11, 2011 (TW) .............................. 100104651 A (51) Int. Cl.
  *G06F 3/042* (2006.01)
  *H01L 25/075* (2006.01)
  *F21V 8/00* (2006.01)

(52) U.S. Cl.
  CPC ............. *G02B 6/001* (2013.01); *H01L 25/0753* (2013.01); *G02B 6/0073* (2013.01); *G02B 6/0021* (2013.01); *G02B 6/0068* (2013.01)
  USPC ........... 345/175; 345/173; 345/102; 345/176; 345/179

(58) Field of Classification Search
  None
  See application file for complete search history.

(56) References Cited

U.S. PATENT DOCUMENTS

| | | | | |
|---|---|---|---|---|
| 4,144,449 | A | * | 3/1979 | Funk et al. ..................... 250/221 |
| 6,139,163 | A | * | 10/2000 | Satoh et al. ................... 362/612 |
| 6,538,644 | B1 | * | 3/2003 | Muraoka ....................... 345/175 |
| 6,803,900 | B1 | * | 10/2004 | Berkoff et al. ................ 345/102 |
| 2003/0067436 | A1 | * | 4/2003 | Hara et al. ..................... 345/102 |
| 2004/0183774 | A1 | * | 9/2004 | Manabe et al. ............... 345/102 |
| 2005/0276566 | A1 | * | 12/2005 | Iimura .......................... 385/146 |
| 2007/0091639 | A1 | * | 4/2007 | Yoo ............................... 362/612 |
| 2007/0159845 | A1 | * | 7/2007 | Hirota et al. .................. 362/600 |
| 2008/0013913 | A1 | | 1/2008 | Lieberman et al. |
| 2008/0049444 | A1 | * | 2/2008 | Hsiao et al. ................... 362/611 |

(Continued)

FOREIGN PATENT DOCUMENTS

CN    201489497 U    5/2010
CN    101833185 A    9/2010

(Continued)

OTHER PUBLICATIONS

Intellectual Property Office, Ministry of Economic Affairs, R.O.C., "Office Action", Dec. 16, 2013, Taiwan.

(Continued)

*Primary Examiner* — Jesus Hernandez
(74) *Attorney, Agent, or Firm* — Morris Manning & Martin LLP; Tim Tingkang Xia, Esq.

(57) ABSTRACT

An optical touch panel includes a panel and a light guide module. The light guide module is disposed on the panel, and the light guide module includes a printed circuit board, at least one light emitting element, and a light guide strip. The light emitting element is electrically disposed on the printed circuit board. The light guide strip is disposed on the printed circuit board, and wraps the light emitting element. Additionally, the light emitting element emits light rays, and the light rays penetrate the light guide strip and are emitted to the panel.

16 Claims, 7 Drawing Sheets

(56) References Cited

U.S. PATENT DOCUMENTS

| | | | |
|---|---|---|---|
| 2009/0168453 A1* | 7/2009 | Koike et al. | 362/611 |
| 2010/0214507 A1* | 8/2010 | Noh et al. | 349/64 |
| 2011/0128255 A1* | 6/2011 | Feng et al. | 345/175 |

FOREIGN PATENT DOCUMENTS

| | | |
|---|---|---|
| TW | 200807105 | 2/2008 |
| TW | 200834954 | 8/2008 |
| TW | M353377 U | 3/2009 |
| TW | 200926434 | 6/2009 |
| TW | M363032 U | 8/2009 |
| TW | 201007275 | 2/2010 |
| TW | 201032106 | 9/2010 |
| TW | 201042302 | 12/2010 |

OTHER PUBLICATIONS

State Intellectual Property Office of the People's Republic of China, "Office Action", China, Apr. 11, 2014.

\* cited by examiner

OPTICAL TOUCH PANEL AND LIGHT GUIDE MODULE THEREOF

CROSS-REFERENCE TO RELATED APPLICATIONS

This non-provisional application claims priority under 35 U.S.C. §119(a) on Patent Application No. 100104651 filed in Taiwan, R.O.C. on Feb. 11, 2011, the entire contents of which are hereby incorporated by reference.

BACKGROUND OF THE INVENTION

1. Field of the Invention

The present invention relates to an optical touch panel, and more particularly to an optical touch panel having a light guide module.

2. Related Art

In recent years, a previous input manner of pressing a mechanical button begins to be replaced with an input manner in which a screen is contacted with an object or a finger. When a user contacts an image on the screen, a tactile feedback system on the screen may convert detected light ray data into an electronic signal and transfer the electronic signal to a processor, and the processor drives various electronic devices with a pre-programmed program, and thus vivid video and audio effects are presented through a screen picture.

A conventional tactile feedback system comprises a glass substrate, a Light Emitting Diode (LED), a photo-sensitive element, a lens, a reflecting element, and a light guide element. The photo-sensitive element, the LED and the lens are configured at an upper right corner of the glass substrate, and the reflecting sheet and the light guide element are simultaneously disposed at left and lower devices of the glass substrate.

The optical touch principle is to illuminate a distal reflecting component by a light emitting device, and when the finger or the contact object shields light rays, the photo-sensitive element may convert sensed and collected light ray changes into an electronic signal, and transfer the electronic signal to the processor to calculate a relative position of the finger or the contact object on the glass substrate. In order to enable the processor to precisely calculate the position of the finger on the glass substrate, internal components of an optical touch screen all need to be aligned repetitively and precisely. However, the number of the internal components of the optical touch screen in the prior art is excessively large, so the optical touch screen in the prior art is confronted with a complicated alignment problem.

Furthermore, the conventional optical touch screen reflects the light rays emitted by the light emitting device with the reflecting element to detect the relative position of the finger or the contact object on the glass substrate, so when the photo-sensitive element is receiving the light rays reflected by the reflecting element, a signal output by the photo-sensitive element is easily influenced by a surrounding light source. Likewise, the light rays reflected by the reflecting component and the light rays emitted by the light emitting device generate interference on the photo-sensitive element, thereby influencing the precision of sensing the light rays by the photo-sensitive element. Additionally, the light emitting device placed at the upper right corner of the glass substrate must illuminate the distal reflecting element, so a light emitting element of the optical touch screen in the prior art needs large brightness output and current input.

SUMMARY OF THE INVENTION

Accordingly, the present invention is an optical touch panel and a light guide module thereof, thereby solving problems in the prior art that large brightness output and current output are needed and repetitive and precise alignment is required during assembling.

The optical touch panel according to the present invention comprises a panel, a sensing element, and a light guide module. The panel has a touch area, and the light guide module is disposed on the panel. Moreover, the light guide module comprises a printed circuit board, at least one light emitting element, and a light guide strip. The light emitting element is electrically disposed on the printed circuit board, and emits light rays. The light guide strip is disposed on the printed circuit board, and wraps the light emitting element. The light guide strip has a first surface and the light rays are emitted out from the first surface, and the first surface is a light transmissive surface. The sensing element is disposed on the panel and located out of the touch area, and the sensing element is used for sensing an image formed when the light rays are projected onto an object.

The light guide module according to the present invention comprises a printed circuit board, a plurality of light emitting elements, and light transmissive plastic. A contact surface of the printed circuit board is rectangular, and the light emitting elements are electrically disposed on the contact surface of the printed circuit board. The light emitting elements are disposed on the contact surface along a long side of the contact surface at a predetermined interval. Finally, the light transmissive plastic is molded on the contact surface of the printed circuit board in a manner of extrusion molding or injection molding, and covers the light emitting elements.

In the optical touch panel according to the present invention, the light emitting element and the printed circuit board are integrated in a manner of extrusion molding or injection molding with the light transmissive plastic, so when the optical touch panel is assembled, it is only necessary to combine the light guide module with the printed circuit board, thereby replacing a method in which a light emitting device and a lens need to be assembled through an alignment reflecting element and a light guide element in the prior art. Therefore, compared with the prior art, the optical touch panel according to the present invention is capable of omitting a complicated alignment process, thereby saving assembling time of the optical touch panel.

In the optical touch panel according to the present invention, light rays are emitted out with a plurality of light emitting elements, and a uniform effect is generated, so as to solve a problem in the prior art that light rays generated by a light emitting device through a lens, a reflecting element and a light guide element are interfered with each other. Therefore, the optical touch panel according to the present invention is capable of reducing brightness needed by the light emitting element, thereby reducing brightness output and current input of the light emitting element.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

In an optical touch panel and a light guide module thereof according to the present invention, the mentioned light emitting element is a component mounted in the optical touch panel, the mentioned light emitting element comprises, but not limited to, a direct-light LED, a side-light LED, or a Cold Cathode Fluorescence Lamp (CCFL), but in the following specific embodiment of the present invention, the direct-light LED is used as an embodiment of the present invention.

Figure 1A:
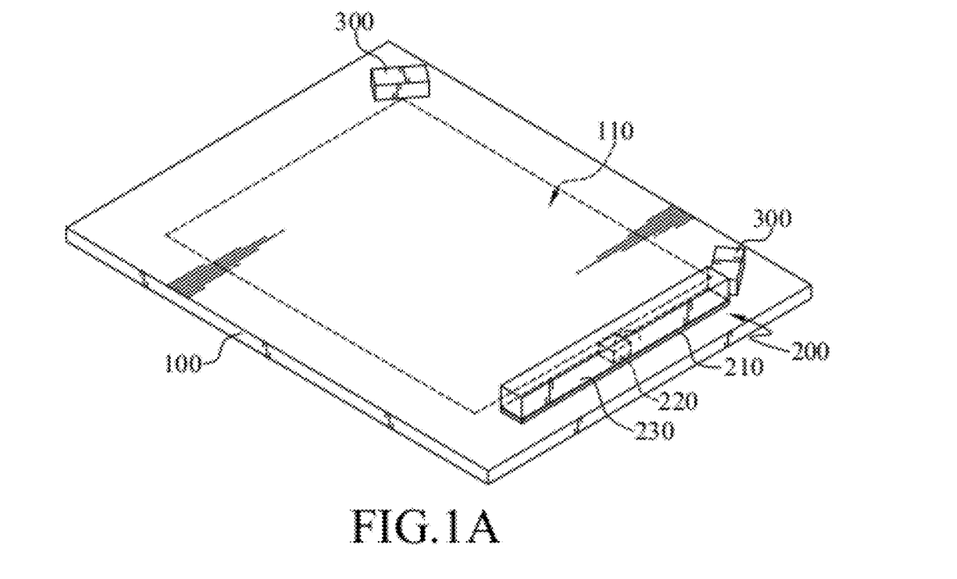
FIG. 1A is a schematic three-dimensional view of an optical touch panel according to a first embodiment of the present invention.
Figure 1B:
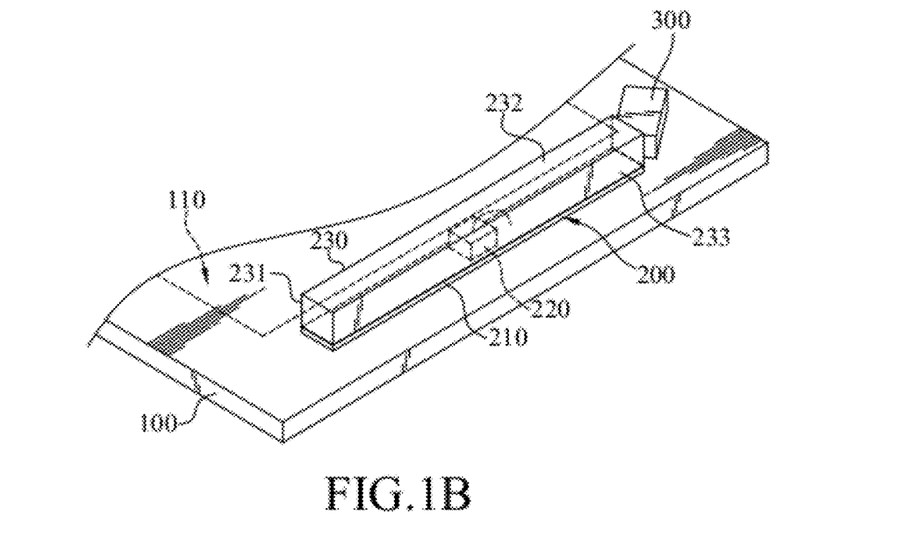
FIG. 1B is a schematic enlarged view of a light guide module in FIG. 1A.
Figure 1C:
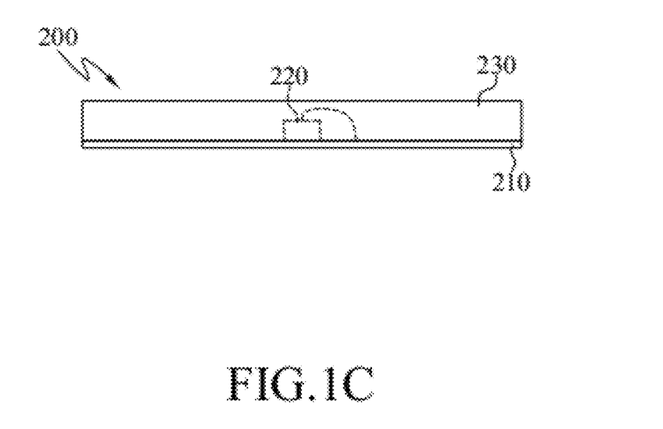
FIG. 1C is a schematic plane view of the light guide module in FIG. 1A.

FIG. 1 is a schematic three-dimensional view of a first embodiment according to the present invention, FIG. 1B is a schematic enlarged view of a light guide module in FIG. 1A, and FIG. 1C is a schematic plane view of the light guide module in FIG. 1A.

Referring to FIG. 1A, the optical touch panel according to the present invention comprises a panel 100, a sensing element 300, and a light guide module 200. The panel 100 is a transparent flat panel of an optical touch screen, and has a touch area 110. The light guide module 200 is disposed at a side edge of the panel 100 and located out of the touch area 110, and emits light rays to the touch area 110. The sensing element 300 is disposed on the panel 100 and located at a corner out of the touch area 110, and the sensing element 300 is used for sensing an image formed when the light rays are projected onto an object.

In this embodiment, the sensing element 300 is disposed at a corner out of the touch area 110, but the present invention is not limited to this, and for design needs, persons skilled in the art may further dispose the sensing element 300 at any position out of the touch area 110, such as at a side edge or a bottom edge.

The light guide module 200 is illustrated in detail hereinafter. Simultaneously referring to FIGS. 1A to 1C, the light guide module 200 according to the present invention comprises a printed circuit board 210, a light emitting element 220, and a light guide strip 230. For example, the printed circuit board 210 is in a strip shape, and the light emitting element 220 is an LED.

Figure 2A:
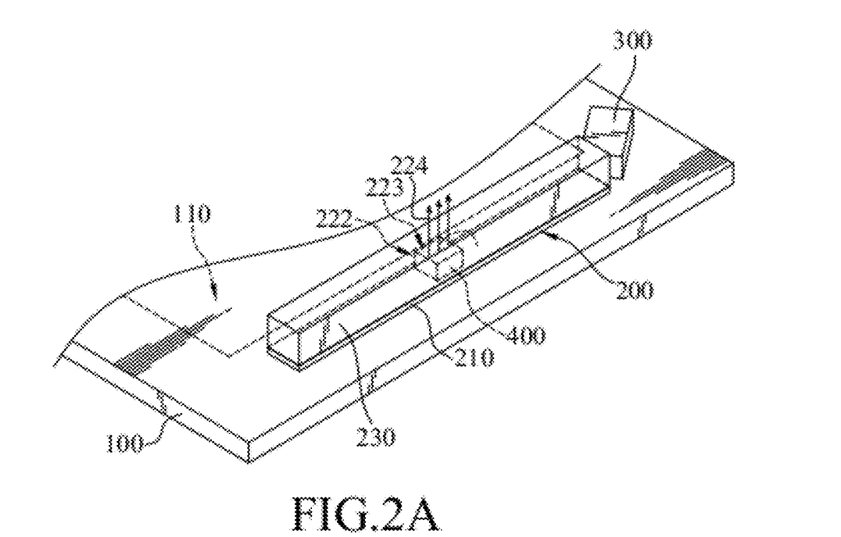
FIG. 2A is a schematic view showing a light ray emission direction of a direct-light LED according to the first embodiment of the present invention.
Figure 2B:
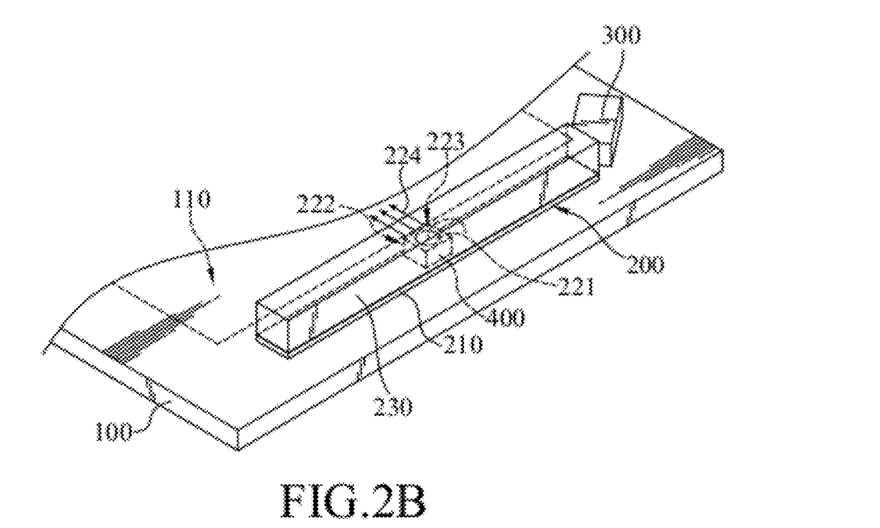
FIG. 2B is a schematic view showing a light ray emission direction of a direct-light LED according to the first embodiment of the present invention.

FIG. 2A is a schematic three-dimensional view showing a light ray emission direction of a direct-light LED, and FIG. 2B is a schematic three-dimensional view of the direct-light LED in FIG. 2A with a metal contact added. Continuously referring to FIGS. 2A and 2B, the light emitting element 220 protrudes on the printed circuit board 210, the light emitting element 220 has a top surface 223 and a first lateral surface 222, and the light emitting element 220 is electrically disposed on the printed circuit board 210 through a metal contact 221 of the top surface 223, so as to enable the light emitting element 220 to obtain supplies of a power supply through the printed circuit board 210. The light emitting element 220 is a direct-light LED 400, a majority of the light rays thereof is mainly emitted out from the top surface 223, and a part of the light rays is emitted from a lateral surface, so in order to enable light rays to be emitted out from a main light exit surface (the first lateral surface 222), in this embodiment, the area of the metal contact 221 is enlarged, so as to mask light rays emitted by the light emitting element 220 from the top surface 223.

Figure 3:
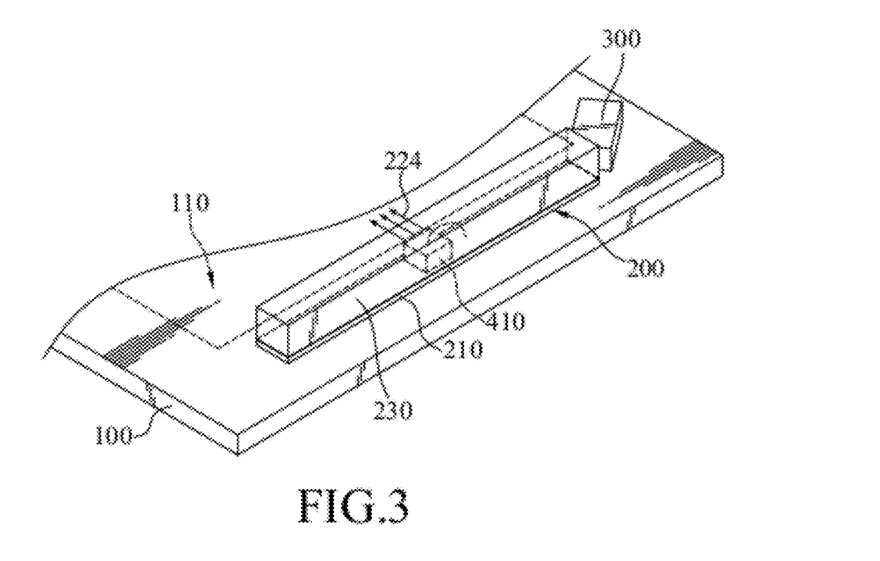
FIG. 3 is a schematic view showing a light ray emission direction of a side-light LED according to the first embodiment of the present invention.

Referring to FIG. 3, FIG. 3 is a schematic three-dimensional view showing a light ray emission direction of a side-light LED. In order to more effectively utilize the light source of the LED, in other embodiments according to the present invention, the LED may be changed into a side-light LED 410, and a light ray emission direction 224 thereof is mainly emitted out from a lateral surface of the LED, and is projected onto the touch area 110.

Figure 4:
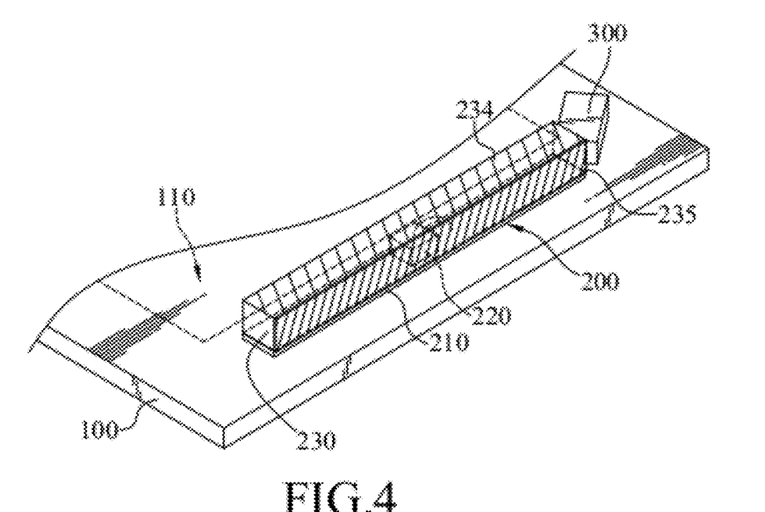
FIGS. 4 and 5 are schematic enlarged views of a light guide strip according to the first embodiment of the present invention.

Referring to FIG. 4, the light guide strip 230 of the light guide module 200 according to the present invention wraps the light emitting element 220. The light guide strip is molded, for example, in an extrusion molding manner or an injection molding manner, and assumes a cuboid shape. A lateral surface facing the touch area 110 of the light guide strip 230 is a first surface 231, a third surface 233 is parallel to the first surface 231, and a second surface 232 connects upper surfaces of the first surface 231 and the third surface 233. In this embodiment, a light-proof surface 234 may also be added to the second surface 232 of the light guide strip 230, so as to mask the light rays emitted by the light emitting element 220 from the second surface 232, thereby avoiding causing light ray interference and influencing touch precision when the light rays are emitted to a non-touch area.

In order to enable the brightness of the optical touch panel 100 to be more uniform and to utilize the light source of the light emitting element 220 more appropriately, in the light guide module 200 according to the present invention, a reflecting component 235 may be further added to the second surface 232 or the third surface 233, or even reflecting components 235 are added to the second surface 232 and the third surface 233 simultaneously. Therefore, the light rays emitted to the second surface 232 or the third surface 233 are reflected onto other surfaces due to being irradiated to the reflecting component 235, so as to increase the probability of the light rays being emitted out from the first surface 231, thereby increasing the brightness and uniformity of the optical touch panel.

Figure 5:
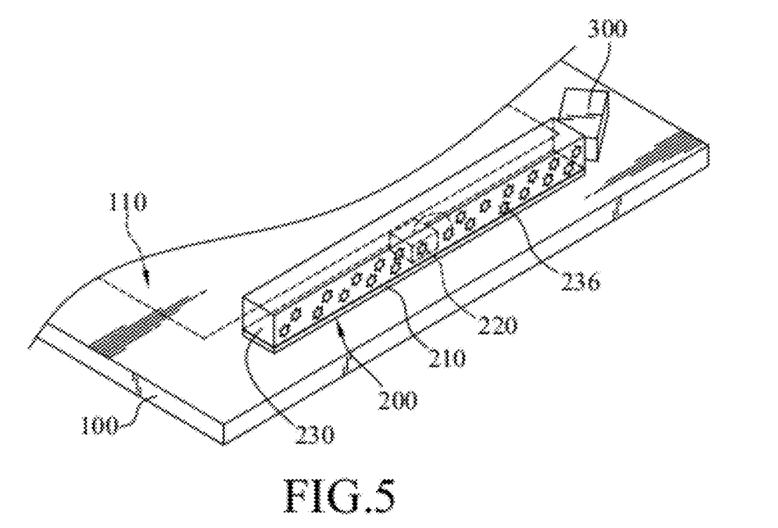

Referring to FIG. 5, in the light guide module 200 according to the present invention, in order to enable the brightness of the optical touch panel to be more uniform and to utilize the light source of the light emitting element 220 more appropriately, a pattern 236 may be further added to the third surface 233 of the light guide strip 230, so as to enable the light rays to be irregularly reflected at the time of passing through the third surface 233.

Figure 6A:
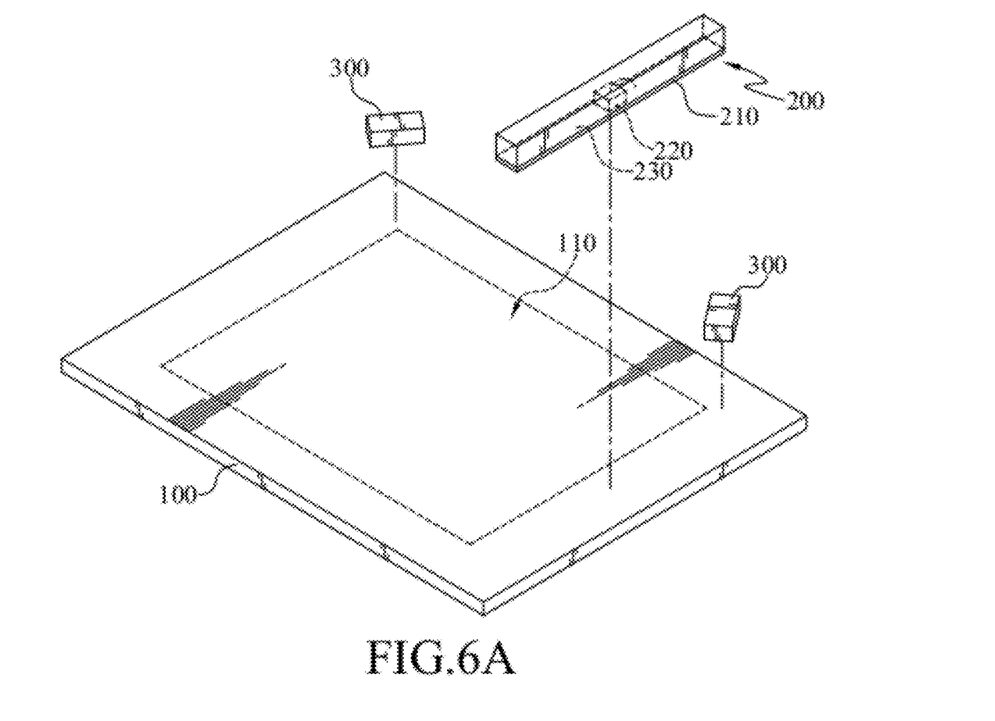
FIGS. 6A, 6B and 6C are schematic assembly views of the optical touch panel according to the first embodiment of the present invention.
Figure 6B:
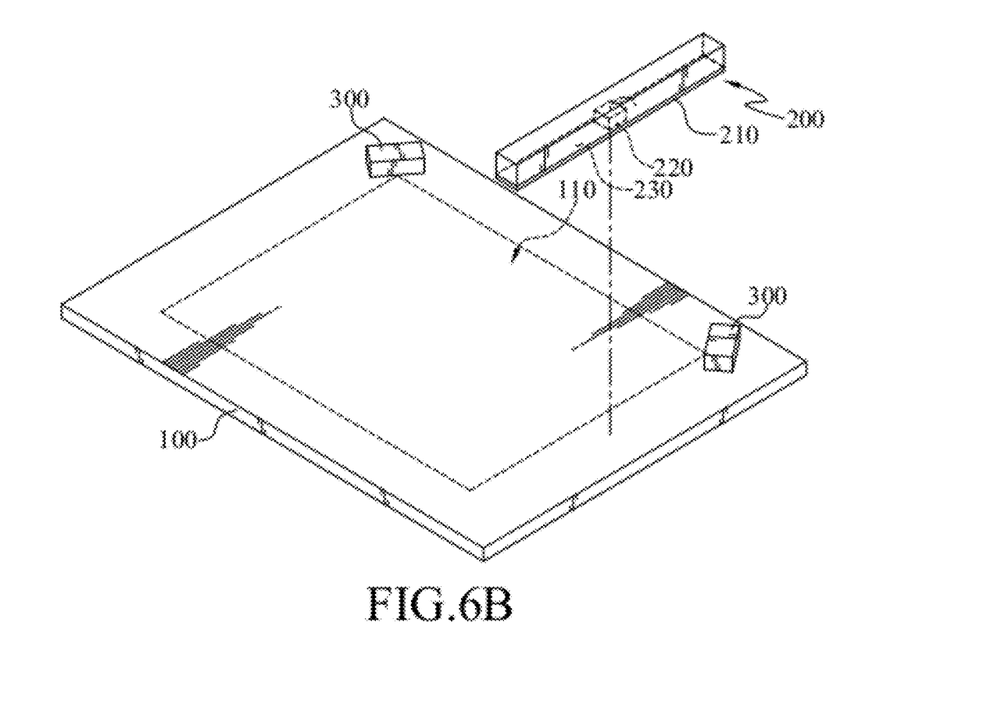
Figure 6C:
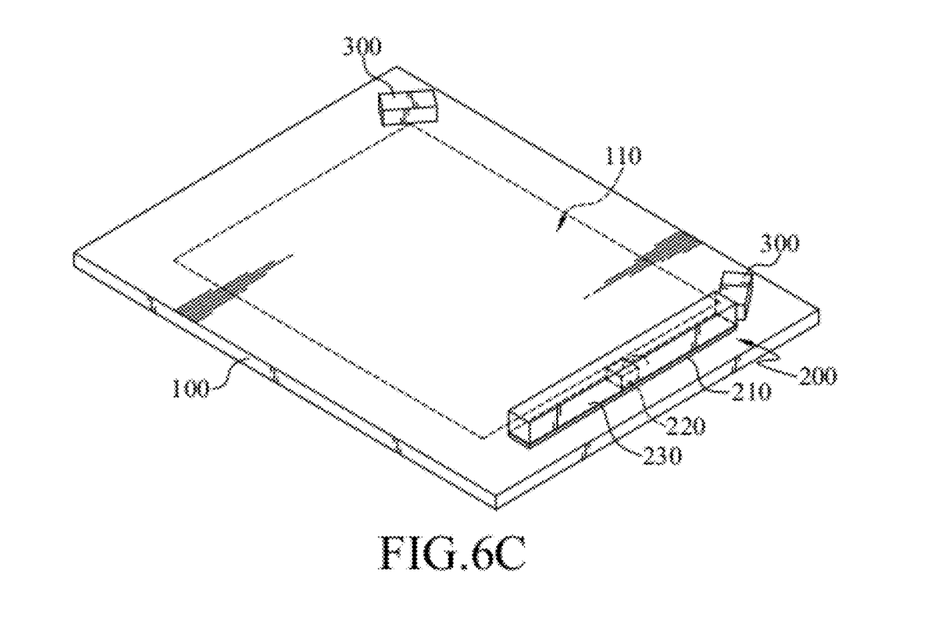

The light guide strip 230 of the optical touch panel according to the present invention wraps the light emitting element 220 in the extrusion molding manner or the injection molding manner, so compared with the prior art, in the present invention, a light emitting element and a light guide strip of a conventional optical touch screen are integrated into a single light guide module 200, thereby reducing assembling steps of the optical touch panel. The assembling of the optical touch panel is illustrated hereinafter. Referring to FIGS. 6A to 6C, a modular light guide module 200 is directly disposed at a side edge of the panel 100, and the sensing element 300 is disposed on the panel 100 and is located at a corner of the touch area 110.

Figure 7A:
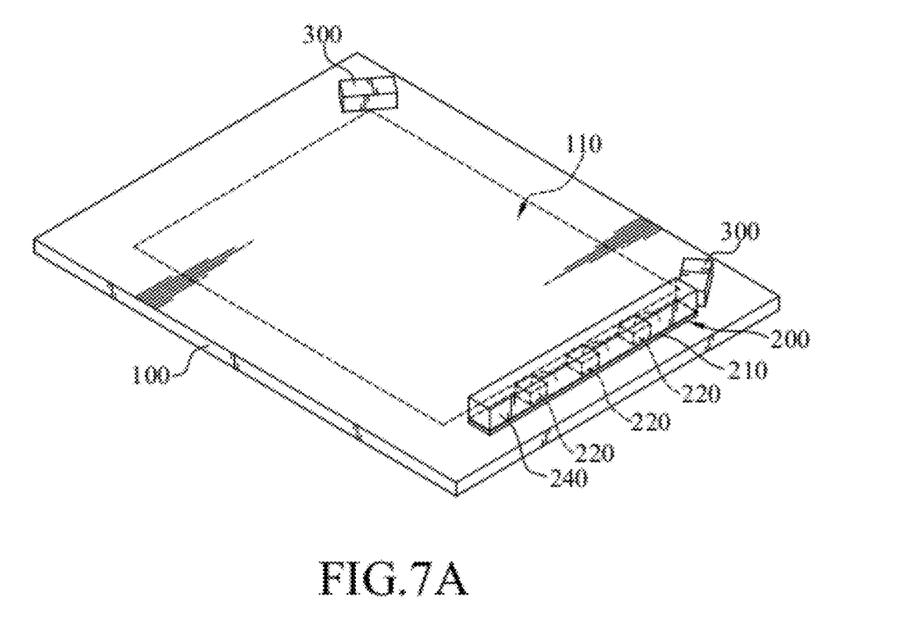
FIG. 7A is a schematic three-dimensional view of an optical touch panel according to a second embodiment of the present invention.
Figure 7B:
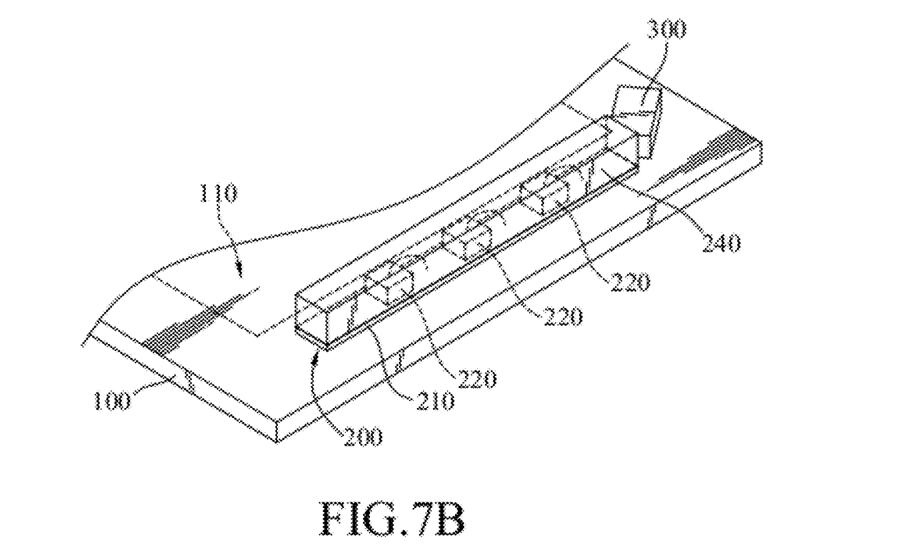
FIG. 7B is a schematic enlarged view of a light guide module in FIG. 7A.

In order to make the brightness of the optical touch screen more uniform, referring to FIGS. 7A and 7B, FIG. 7A is a schematic three-dimensional view of an optical touch panel according to a second embodiment of the present invention, and FIG. 7B is a schematic enlarged view of a light guide module in FIG. 7A. In the light guide module 200 according to the present invention, the printed circuit board 210 further has a plurality of light emitting elements 220 disposed thereon. The contact surface between the printed circuit board 210 and the light emitting element 220 is rectangular. The light emitting elements 220 are electrically disposed on the contact surface of the printed circuit board 210, and the light emitting elements 220 are disposed on the contact surface along a long side of the contact surface at a predetermined interval. A light transmissive plastic 240 is molded above the contact surface of the printed circuit board 210 in a manner of extrusion molding or injection molding, and covers the light emitting elements 220. The light transmissive plastic 240 is the light guide strip 230.

The light guide strip 230 of the optical touch panel according to the present invention wraps the light emitting elements 220 and the reflecting component 235 in the extrusion pressing molding manner or the injection molding manner, in which the reflecting component 235 may also be attached to an external surface of the light guide strip 230, so compared with the prior art, in the present invention, three internal components comprising an LED, a light guide element and a reflecting sheet of a conventional optical touch screen are integrated into a single light guide module 200, thereby shortening assembling time of the optical touch panel.

Additionally, the reflecting sheet is assembled in the light guide module 200, so interference of the light rays is performed in the light guide module 200, and then the light rays are projected onto the touch area 110, so as to solve the problem that the interference of the light rays is generated in the touch area 110 to cause redundant light rays to be projected into a photo-sensitive element, thereby reducing touch precision in the prior art. Likewise, in the optical touch panel according to the present invention, the reflecting component 235 makes the brightness of the optical touch panel more uniform.

Moreover, a plurality of light emitting elements 220 of the optical touch panel according to the present invention is distributed on the printed circuit board 210 at a predetermined interval, so besides being capable of increasing the brightness of the optical touch panel due to the increased number of the light emitting elements 220, the uniformity of the optical touch panel may also be increased since the light rays are emitted into the touch area 110 from different angles.

What is claimed is:

1. An optical touch panel, comprising:
   a panel, having a touch area;
   a light guide module, disposed on the panel, and the light guide module comprising:
      a printed circuit board;
      at least one light emitting element, electrically disposed on the printed circuit board, wherein the light emitting element emits light rays; and
      a light guide strip, disposed on the printed circuit board, wrapping the light emitting element, and having a first surface, wherein the first surface is a light transmissive surface and the light rays are emitted out from the first surface, wherein the light guide strip further has a second surface and a third surface, the third surface is parallel to the first surface, and the second surface is connected between the first surface and the third surface, the light emitting element is a direct-light Light Emitting Diode (LED), an upper surface of each of the light emitting elements faces the second surface, and the upper surface is a light-proof surface, thereby masking the light rays emitted towards the second surface, the upper surface of each of the light emitting elements is a metal contact of the light emitting element, and wherein an area of the metal contact is approximately equal to an area of the upper surface, thereby masking the light rays emitted towards the second surface by the light emitting element; and
   a sensing element, disposed on the panel and located out of the touch area, wherein the sensing element is used for sensing an image formed when the light rays are projected onto an object.

2. The optical touch panel according to claim 1, wherein the light guide strip wraps the light emitting elements in a manner of extrusion molding or injection molding.

3. The optical touch panel according to claim 1, wherein the second surface and/or the third surface has a reflecting component.

4. The optical touch panel according to claim 1, wherein the third surface of the light guide strip has a pattern, so that the light rays are irregularly reflected on the third surface.

5. The optical touch panel according to claim 1, wherein the light emitting element is a side-light LED, the light rays of the light emitting element is emitted out from a lateral surface, and the upper surface of the light emitting element does not emit the light rays.

6. The optical touch panel according to claim 1, further comprising a plurality of light emitting elements, the light emitting elements are electrically disposed on the printed circuit board, and the light emitting elements are arranged at an interval.

7. A light guide module, comprising:
   a printed circuit board;
   at least one light emitting element, electrically disposed on the printed circuit board, wherein the light emitting element emits light rays; and
   a light guide strip, disposed on the printed circuit board, wrapping the light emitting element, and having a first surface, wherein the first surface is a light transmissive surface, and the light rays are emitted out from the first surface;
   wherein the light guide strip further has a second surface and a third surface, the third surface is parallel to the first surface, and the second surface is connected between the first surface and the third surface, the light emitting element is a direct-light Light Emitting Diode (LED), and an upper surface of each of the light emitting elements facing the second surface is a light-proof surface, thereby masking the light rays emitted towards the second surface, wherein the upper surface of each of the light emitting elements is a metal contact of the light emitting element, and an area of the metal contact is approximately equal to an area of the upper surface, thereby masking the light rays emitted by the light emitting element towards the second surface.

8. The light guide module according to claim 7, wherein the light guide strip wraps the light emitting element in a manner of extrusion molding or injection molding.

9. The light guide module according to claim 7, wherein the second surface and/or the third surface has a reflecting component.

10. The light guide module according to claim 7, wherein the third surface of the light guide strip has a pattern, so that the light rays are irregularly reflected on the third surface.

11. The light guide module according to claim 7, wherein the light emitting element is a side-light LED, the light rays of the light emitting element are emitted out from a lateral surface, and the upper surface of the light emitting element does not emit the light rays.

12. The light guide module according to claim 7, further comprising a plurality of light emitting elements, the light emitting elements are electrically disposed on the printed circuit board, and the light emitting elements are arranged at an interval.

13. A light guide module, comprising:
a printed circuit board, wherein a contact surface of the printed circuit board is rectangular;
a plurality of light emitting elements, electrically disposed on the contact surface of the printed circuit board, wherein the light emitting elements are disposed on the contact surface along a long side of the contact surface at a predetermined interval; and
a light transmissive plastic, molded above the contact surface of the printed circuit board in a manner of extrusion molding or injection molding, and covering the light emitting elements, wherein the light transmissive plastic further has a second surface and a third surface, the third surface is parallel to a first surface, and the second surface is connected between the first surface and the third surface, wherein the light emitting elements are direct-light Light Emitting Diodes (LEDs), and an upper surface of each of the light emitting elements facing the second surface is a light-proof surface, thereby masking the light rays emitted towards the second surface, wherein the upper surface of each of the light emitting elements is a metal contact of the light emitting elements, and an area of the metal contact is approximately equal to an area of the upper surface, thereby masking the light rays emitted by the light emitting elements towards the second surface.

14. The light guide module according to claim 13, wherein the second surface and/or the third surface has a reflecting component.

15. The light guide module according to claim 13, wherein the third surface of the light transmissive plastic has a pattern, so that the light rays are irregularly reflected on the third surface.

16. The light guide module according to claim 13, wherein the light emitting elements are side-light LEDs, the light rays of the light emitting elements are emitted out by a lateral surface, and an upper surface of the light emitting elements does not emit the light rays.

* * * * *